United States Patent
Zi et al.

(10) Patent No.: US 12,181,798 B2
(45) Date of Patent: *Dec. 31, 2024

(54) EXTREME ULTRAVIOLET PHOTOLITHOGRAPHY METHOD WITH DEVELOPER COMPOSITION

(71) Applicant: Taiwan Semiconductor Manufacturing Co., Ltd., Hsin-Chu (TW)

(72) Inventors: An-Ren Zi, Hsinchu (TW); Joy Cheng, Taoyuan (TW); Ching-Yu Chang, Yilang County (TW); Chin-Hsiang Lin, Hsin-Chu (TW)

(73) Assignee: TAIWAIN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/446,702

(22) Filed: Aug. 9, 2023

(65) Prior Publication Data

US 2024/0045327 A1  Feb. 8, 2024

Related U.S. Application Data

(63) Continuation of application No. 17/121,080, filed on Dec. 14, 2020, now Pat. No. 11,822,238, which is a continuation of application No. 15/617,300, filed on Jun. 8, 2017, now Pat. No. 10,866,511.

(60) Provisional application No. 62/434,950, filed on Dec. 15, 2016.

(51) Int. Cl.
  *G03F 7/32* (2006.01)
  *G03F 7/004* (2006.01)
  *G03F 7/30* (2006.01)
  *G03F 7/36* (2006.01)

(52) U.S. Cl.
  CPC .......... *G03F 7/0042* (2013.01); *G03F 7/0047* (2013.01); *G03F 7/32* (2013.01); *G03F 7/325* (2013.01); *G03F 7/30* (2013.01); *G03F 7/36* (2013.01)

(58) Field of Classification Search
  CPC ...... G03F 7/0042; G03F 7/0047; G03F 7/325; G03F 7/322
  See application file for complete search history.

(56) References Cited

U.S. PATENT DOCUMENTS

| | | |
|---|---|---|
| 8,796,666 B1 | 8/2014 | Huang et al. |
| 9,012,132 B2 | 4/2015 | Chang |
| 9,028,915 B2 | 5/2015 | Chang et al. |
| 9,093,530 B2 | 7/2015 | Huang et al. |
| 9,146,469 B2 | 9/2015 | Liu et al. |
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 10,866,511 B2 | 12/2020 | Zi et al. |
| 11,822,238 B2 * | 11/2023 | Zi ................. G03F 7/0047 |
| 2006/0257785 A1 | 11/2006 | Johnson |
| 2013/0296214 A1 | 11/2013 | Barnes et al. |
| 2014/0272724 A1 | 9/2014 | Wang et al. |
| 2015/0192851 A1 | 7/2015 | Yamashita et al. |
| 2018/0173096 A1 | 6/2018 | Zi et al. |

FOREIGN PATENT DOCUMENTS

| | | |
|---|---|---|
| CN | 103003923 A | 3/2013 |
| CN | 103229102 A | 7/2015 |
| CN | 105388709 A | 3/2016 |
| JP | 2016-75853 | 5/2016 |
| TW | 201634756 A | 10/2016 |

OTHER PUBLICATIONS

English Translation of JP 2016-75853, Detailed description of the invention, pp. 1-56, May 12, 2016 (Year: 2016).

* cited by examiner

*Primary Examiner* — Daborah Chacko-Davis
(74) *Attorney, Agent, or Firm* — HAYNES AND BOONE, LLP

(57) ABSTRACT

The present disclosure provides a method for lithography patterning in accordance with some embodiments. The method includes forming a photoresist layer over a substrate, wherein the photoresist layer includes a metal-containing chemical; performing an exposing process to the photoresist layer; and performing a first developing process to the photoresist layer using a first developer, thereby forming a patterned resist layer, wherein the first developer includes a first solvent and a chemical additive to remove metal residuals generated from the metal-containing chemical.

20 Claims, 7 Drawing Sheets

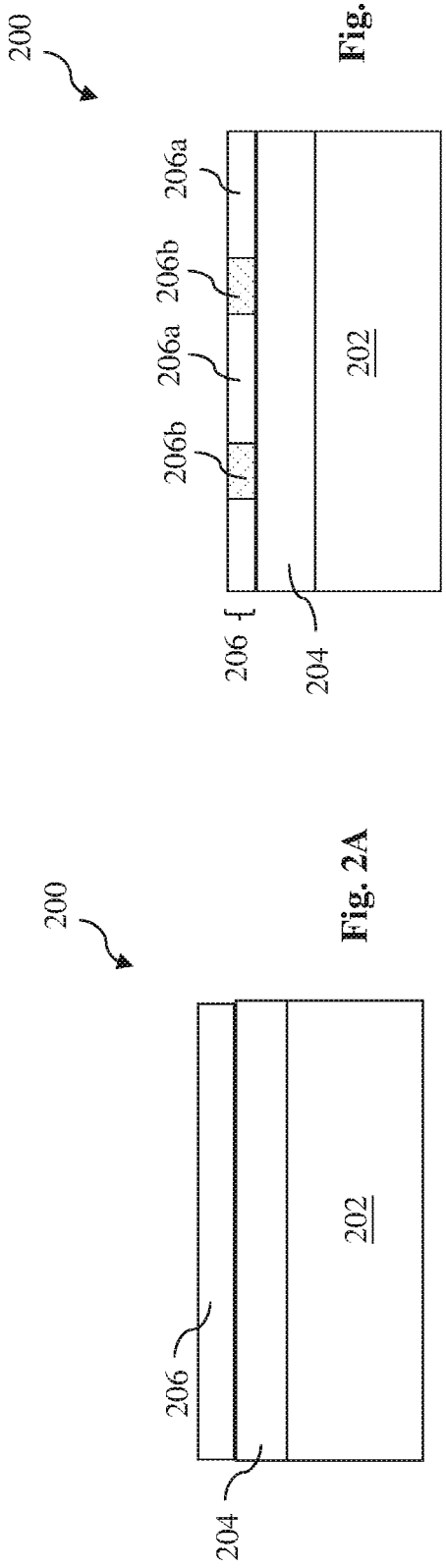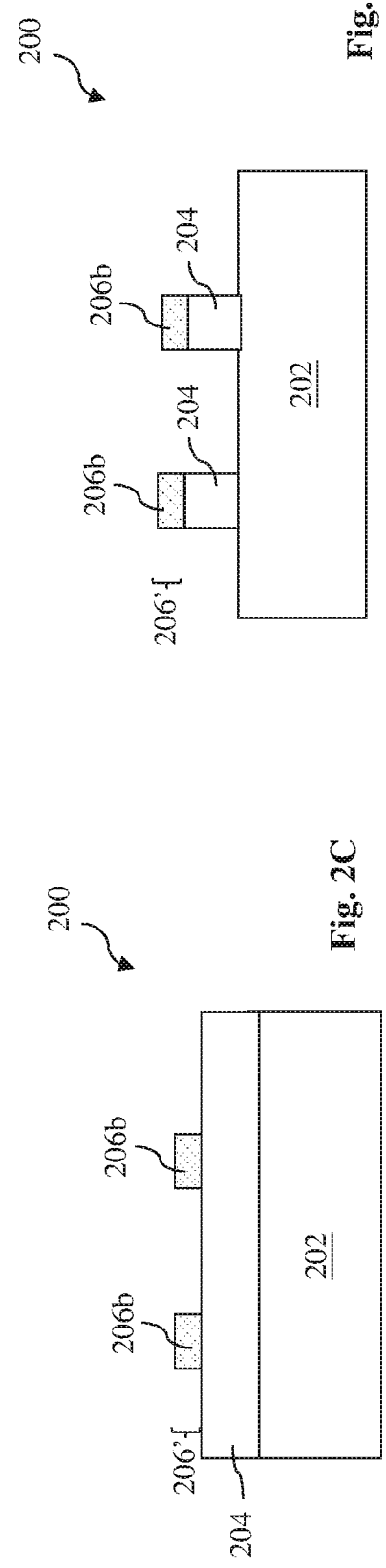

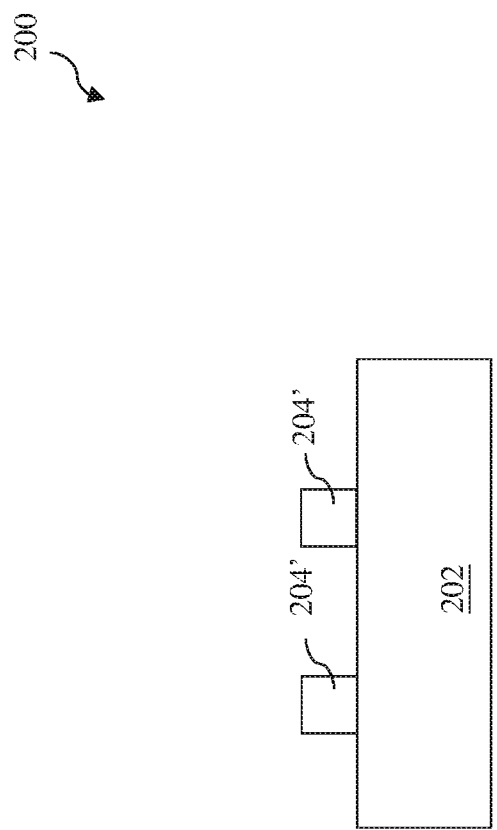

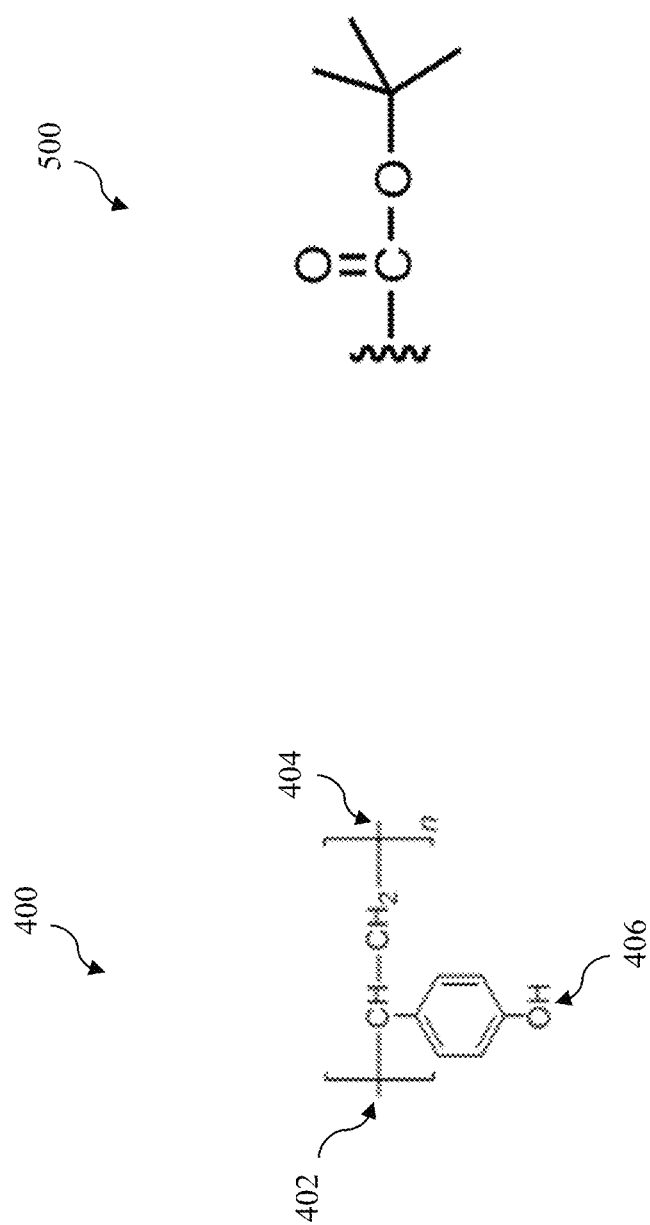

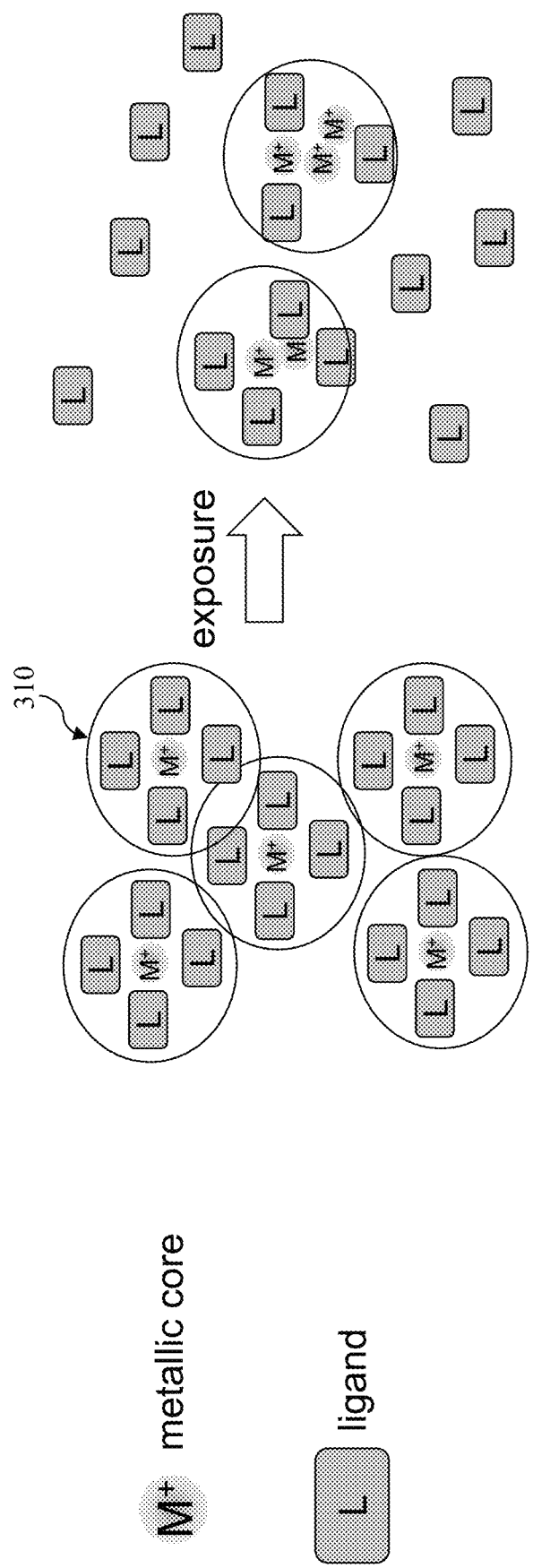

EXTREME ULTRAVIOLET PHOTOLITHOGRAPHY METHOD WITH DEVELOPER COMPOSITION

PRIORITY DATA

The present application is a continuation of U.S. patent application Ser. No. 17/121,080, filed Dec. 14, 2020, which is a continuation of U.S. patent application Ser. No. 15/617,300, filed Jun. 8, 2017, which claims the benefit of U.S. Provisional Application No. 62/434,950, filed Dec. 15, 2016, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. For example, as the semiconductor fabrication continues to shrink pitches below 20 nm nodes, traditional i-ArF were confronted a huge challenge. The optical restriction leads to resolution and lithography performance that cannot meet targets. Extreme ultraviolet (EUV) lithography has been utilized to support critical dimension (CD) requirements of smaller devices. EUV lithography employs scanners using radiation in the EUV region, having a wavelength of about 1 nm to about 100 nm. Some EUV scanners provide 4× reduction projection printing onto a resist film coated on a substrate, similar to some optical scanners, except that the EUV scanners use reflective rather than refractive optics. EUV lithography has imposed a complex set of requirements upon the resist film. The photo acid generator (PAG) in ArF resist absorbs 193 nm wave and generates photoacid, and the acid has 1000 times chemical amplifier reaction (CAR) and deprotects acid labile group. However, the PAG is not sensitive to EUV. Due to low source power of EUV tool and other factors, photoresist is not efficient to generate enough acid for desired resolution, leading to various patterning issues, such as line width roughness and CD uniformity. What are needed are a photoresist and a method of lithography patterning to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D and 2E illustrate cross sectional views of a semiconductor structure at various fabrication stages, in accordance with some embodiments.

FIG. 4 illustrates a chemical structure of the polymer in the resist material of FIG. 3 in accordance with an embodiment.

FIG. 5 illustrates a chemical structure of the ALG in the resist material of FIG. 3 in accordance with an embodiment.

FIG. 7 illustrates the metal-containing chemical of the resist material of FIG. 3 through a lithography exposing process in accordance with an embodiment.

DETAILED DESCRIPTION

Figure 1:
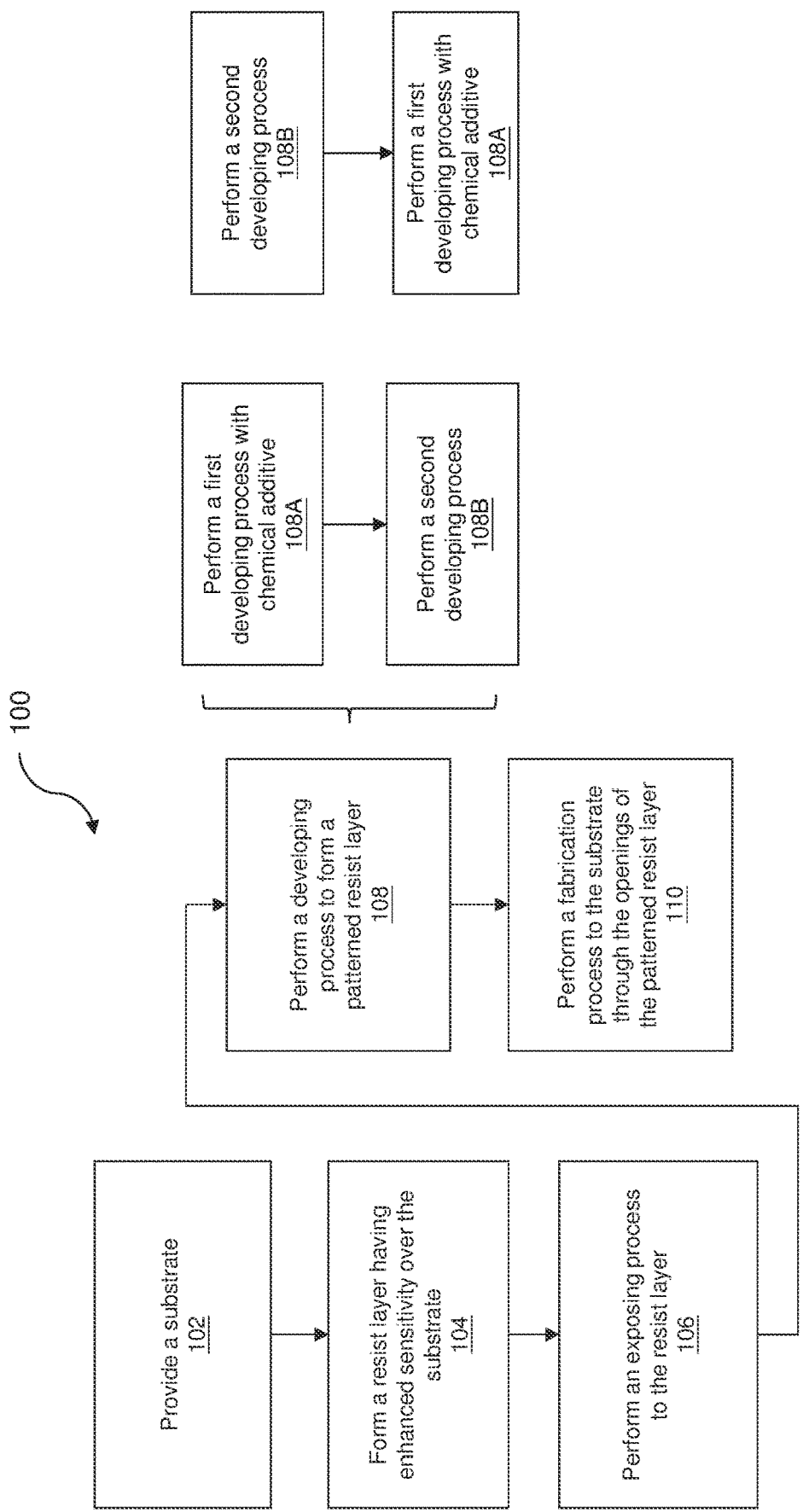
FIG. 1 illustrates a flow chart of a lithography patterning method in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to compositions of photosensitive films in extreme ultraviolet (EUV) lithography and methods of using the same. In lithography patterning, after a resist film is exposed to a radiation, such as a EUV radiation (or alternatively other radiation, such as an electron beam), it is developed in a developer (a chemical solution). The developer removes portions (such as exposed portions as in a positive-tone photoresist or unexposed portions as in a negative-tone photoresist) of the resist film, thereby forming a resist pattern which may include line patterns and/or trench patterns. The resist pattern is then used as an etch mask in subsequent etching processes, transferring the pattern to an underlying material layer. Alternatively, the resist pattern is then used as an ion implantation mask in subsequent ion implantation processes applied to the underlying material layer, such as an epitaxial semiconductor layer.

Generally, to produce the smallest possible circuitry, most advanced lithography systems are designed to use light of very short wavelength such as for example, deep-ultraviolet light at a wavelength at or below 200 nm, or extreme ultraviolet (EUV) in the region of about 13.5 nm. Such light sources are relatively weak, so the photosensitive films (e.g., a photoresist) need to be designed to utilize this light as efficiently as possible. Essentially photoresists used today for microelectronic/nanoelectronic fabrication employ the concept of chemical amplification to enhance the efficiency of light utilization.

A photoresist that employs the chemical amplification is generally referred to as a "chemically amplified resist (CAR)". The photoresist includes a polymer that resists to etching or ion implantation during semiconductor fabrication; an acid generating compound (e.g., photo acid generator (PAG)); and a solvent. In some examples, the polymer also includes at least one acid labile group (ALG) that responds to acid. PAG absorbs radiation energy and generates acid. The polymer and the PAG are mixed in the solvent before the photoresist is applied to a workpiece, such as a semiconductor wafer, during a lithography process. The PAG is not sensitive to the EUV radiation. That is, advance to improve lithography efficiency (e.g., resolution/contrast, line-width-roughness, and sensitivity) encounters issues. Due to limited source power of a EUV lithography system, an existing photoresist cannot provide imaging effect during a lithography exposure process with desired resolution and contrast. Therefore, the disclosed photoresist further includes metal-containing chemical to increase the sensitivity of the photoresist. The metal-containing chemical may function as a sensitizer or through other mechanism to increase the sensitivity, which will be further explained later. For example, the sensitizer is sensitive to EUV radiation, absorbs EUV radiation and generates electron. Thus, the PAG absorbs electron and generates acid. However, the metal-containing chemical leaves metal residuals during subsequent processing operation, which may result in metal contamination during the subsequent processes. The disclosed photolithography process and the developer address the concern.

FIG. 1 is a flowchart of a method 100 of patterning a substrate (e.g., a semiconductor wafer) according to various aspects of the present disclosure in some embodiments. The method 100 may be implemented, in whole or in part, by a system employing advanced lithography processes with radiation such as, extreme ultraviolet (EUV) light, or other radiation such as deep ultraviolet (DUV) light, electron beam (e-beam) lithography, or x-ray lithography to improve pattern dimension accuracy. In the present embodiment, EUV lithography is used as the primary example. Additional operations can be provided before, during, and after the method 100, and some operations described can be replaced, eliminated, or moved around for additional embodiments of the method.

FIGS. 2A through 2E are sectional views of a semiconductor structure 200 at various fabrication stages, constructed in accordance with some embodiments. The method 100 is described below in conjunction with FIG. 1 and FIGS. 2A through 2E wherein the semiconductor structure 200 is fabricated by using embodiments of the method 100. The semiconductor structure 200 may be an intermediate workpiece during the fabrication of an integrated circuit (IC), or a portion thereof. The IC may include logic circuits, memory structures, passive components (such as resistors, capacitors, and inductors), and active components such as diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin-like FETs (FinFETs), other three-dimensional (3D) FETs, and combinations thereof.

Referring now to FIG. 1 in conjunction with FIG. 2A, the method 100 begins at block 102 with a semiconductor structure 200. The semiconductor structure 200 includes a substrate 202. In an embodiment, the substrate 202 is a semiconductor substrate (e.g., wafer). In furtherance of the embodiment, the substrate 202 includes silicon in a crystalline structure. In alternative embodiments, the substrate 202 includes other elementary semiconductors such as germanium, or a compound semiconductor such as silicon carbide, gallium arsenide, indium arsenide, and indium phosphide. The substrate 202 includes one or more layers of material or composition. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers.

In the present embodiment, the substrate 202 includes an underlayer (or material layer) 204 to be processed, such as to be patterned or to be implanted. For example, the underlayer 204 is a hard mask layer to be patterned. In another example, the underlayer 204 is an epitaxial semiconductor layer to be ion implanted. However, in an alternative embodiment, the substrate 202 may not include an underlayer. In an embodiment, the underlayer 204 is a hard mask layer including material(s) such as silicon oxide, silicon nitride (SiN), silicon oxynitride, or other suitable material or composition. In an embodiment, the underlayer 204 is an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide. In various embodiments, the underlayer 204 may include a high-k dielectric layer, a gate layer, a hard mask layer, an interfacial layer, a capping layer, a diffusion/barrier layer, a dielectric layer, a conductive layer, other suitable layers, and/or combinations thereof.

In some embodiments, the structure 200 may be alternatively a photomask used to pattern a semiconductor wafer. In furtherance of the embodiments, the substrate 202 is a photomask substrate that may include a transparent material (such as quartz), or a low thermal expansion material such as silicon oxide-titanium oxide compound. The photomask substrate 202 may further include a material layer to be patterned. To further this example, the substrate 202 may be a photomask substrate for making a deep ultraviolet (DUV) mask, an extreme ultraviolet (EUV) mask, or other types of masks. Accordingly, the underlayer 204 is material layer to be patterned to define a circuit pattern. For example, the underlayer 204 is an absorber layer, such as chromium layer for DUV photomask or tantalum boron nitride (TaBN) for EUV photomask.

The method 100 proceeds to operation 104 with forming a photoresist layer (or simply resist layer) 206 over the substrate 202 (FIG. 2A). The resist layer 206 is sensitive to radiation used in a lithography exposure process and has a resistance to etch (or implantation). In some embodiments, the resist layer 206 includes dual layer or tri-layer for lithography patterning. For example, the tri-layer resist includes a bottom layer, a middle layer on the bottom layer and a photosensitive layer on the middle layer. The bottom and middle layers are designed with different composition for etch selectivity. In furtherance of the example, the bottom layer is a carbon-rich polymeric material and the middle layer is a silicon-rich material. In FIG. 2A, only photosensitive layer is illustrated and is referred to as resist layer 206. However, it is only for illustration without limiting. It may include additional layer, such as those in the dual layer or tri-layer resist scheme. Referring to FIG. 2A, the resist layer 206 is formed by spin-on coating process in an embodiment. In some embodiments, the resist layer 206 is further treated with a soft baking process. The resist layer 206 is sensitive to a radiation, such as I-line light, a DUV light (e.g., 248 nm radiation by krypton fluoride (KrF) excimer laser or 193 nm radiation by argon fluoride (ArF) excimer laser), a EUV light (e.g., 135 nm light), an electron beam (e-beam), and an ion beam. In the present embodiment, the resist layer 206 is sensitive to EUV radiation.

Figure 3:
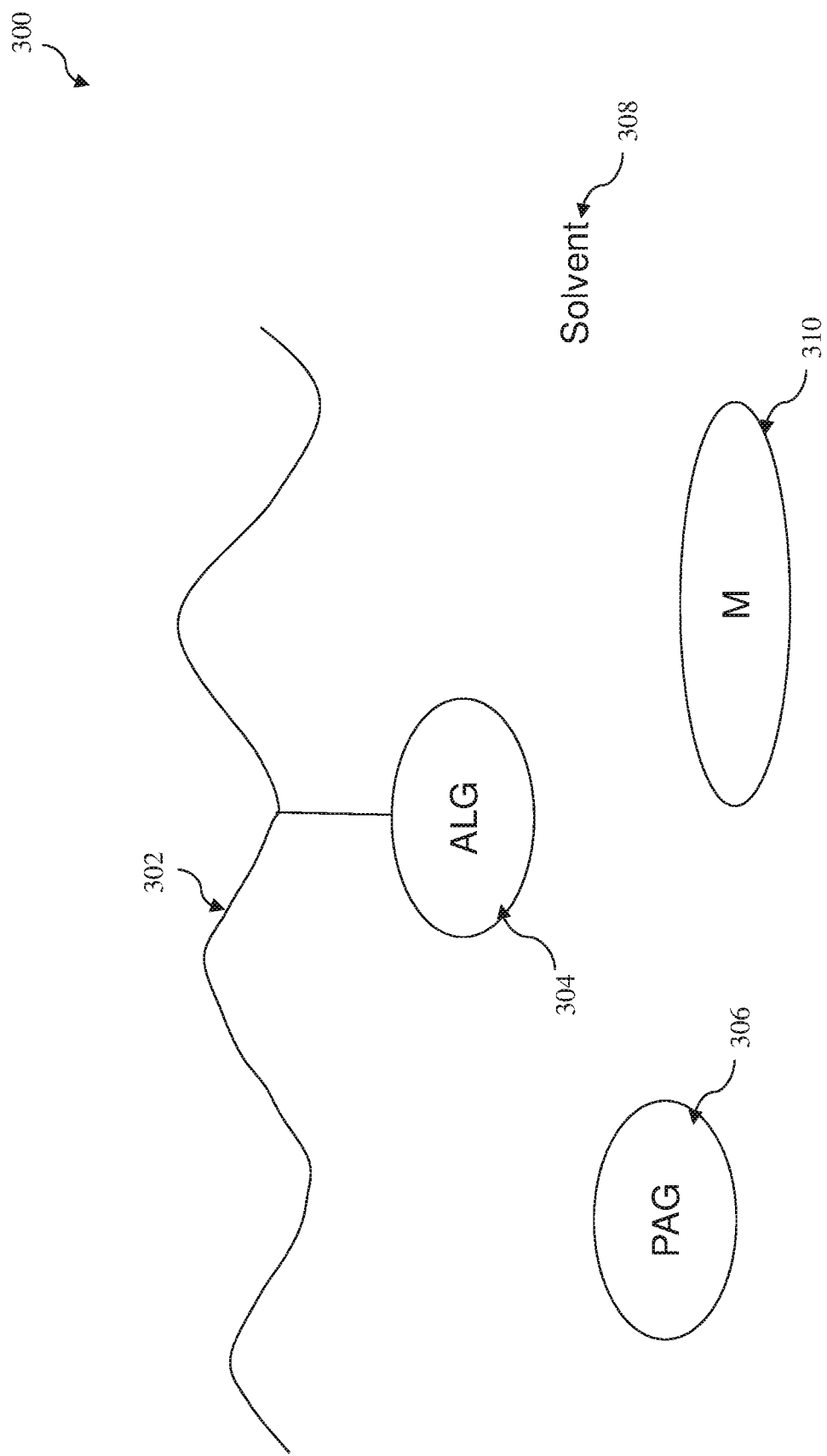
FIG. 3 illustrates a resist material of FIG. 2A in accordance with some embodiments.

FIG. 3 shows an embodiment of a resist material 300 of the resist layer 206, constructed in accordance with some embodiments. In the present example, the photoresist 300 utilizes a chemical amplification (CA) resist material. For example, the CA resist material is negative tone and includes a polymer material that turns insoluble to a developer such as a base solution after the polymer is reacted with acid. In another example, the CA resist material is positive tone and includes a polymer material that turns soluble to a developer after the polymeric material is reacted with acid. In yet another example, the CA resist material includes a polymer material that changes its polarity after the polymer is reacted with acid.

The resist material 300 is sensitive to a first radiation, such as extreme ultraviolet (EUV) light, from the radiation source of a lithography system. The first radiation has a first wavelength. The resist material 300 includes a polymer 302 to provide resistance to etch (or implantation). In various embodiments, the polymer 302 includes a poly(norbornene)-co-malaic anhydride (COMA) polymer, a polyhydroxystyrene (PHS) polymer, or an acrylate-based polymer. For example, the acrylate-based polymer includes a poly (methyl methacrylate) (PMMA) polymer. The PHS polymer includes a plurality of PHS chemical structure 400 shown in FIG. 4, in which n is an integer greater than 2. The PHS chemical structure 400 includes two ends 402 and 404 that are chemically linkable to other PHS chemical structures. Furthermore, PHS is also sensitive to EUV and is able to function as sensitizer for EUV resist. Accordingly, a plurality of the chemical structures 400 are chemically bonded together (through the two ends 402 and 404), thereby forming a PHS polymeric backbone. The polymer 302 also includes multiple side locations that may chemically bond with other chemicals. For example, the PHS polymer incudes a plurality of hydroxyl (OH) groups 406 that may chemically bond to other chemicals.

In some examples, the resist material 300 further includes a blocking group 304, such as acid labile group (ALG) or dissolution inhibitor that responds to acid. In the present embodiment, the blocking group 304 is chemically bonded to the polymer 302, such as bonded to the OH groups 406 of PHS in one example. The ALG 304 is a chemical group that is deprotected by PAG in exposed areas of the resist layer. Thus, the exposed resist material 300 may change polarity and dissolubility. For example, the exposed resist material has an increased dissolubility in a developer (for a positive-tone resist) or decreased dissolubility in a developer (for a negative-tone resist). When the exposing dose of the lithography exposing process reaches a dose threshold, the exposed resist material will be dissoluble in the developer or alternatively the exposed resist material will be soluble in the developer. In one example, the ALG 304 includes a t-butoxycardbonyl (tBOC) 500 illustrated in FIG. 5.

The resist material 300 includes an acid generating compound 306, such as photoacid generator (PAG). The acid generating compound (or PAG) 306 absorbs radiation energy and generates acid. The resist material 300 also includes a solvent 308. The polymer 302 and the acid generating compound 306 are mixed in the solvent 308 before the resist material is applied to a workpiece, such as a semiconductor wafer, during a lithography process. In some embodiments, the acid generating compound 306 includes a phenyl ring. In a particular example, the acid generating compound 306 includes a sulfonium cation, such as a triphenylsulfonium (TPS) group; and an anion, such as a triflate anion. Particularly, the cation of the PAG has a chemical bond to a sulfur and an additional chemical bond such that the sensitivity (or absorption) of the PAG to the electron (or other type of the second radiation) is increased.

Figure 6:
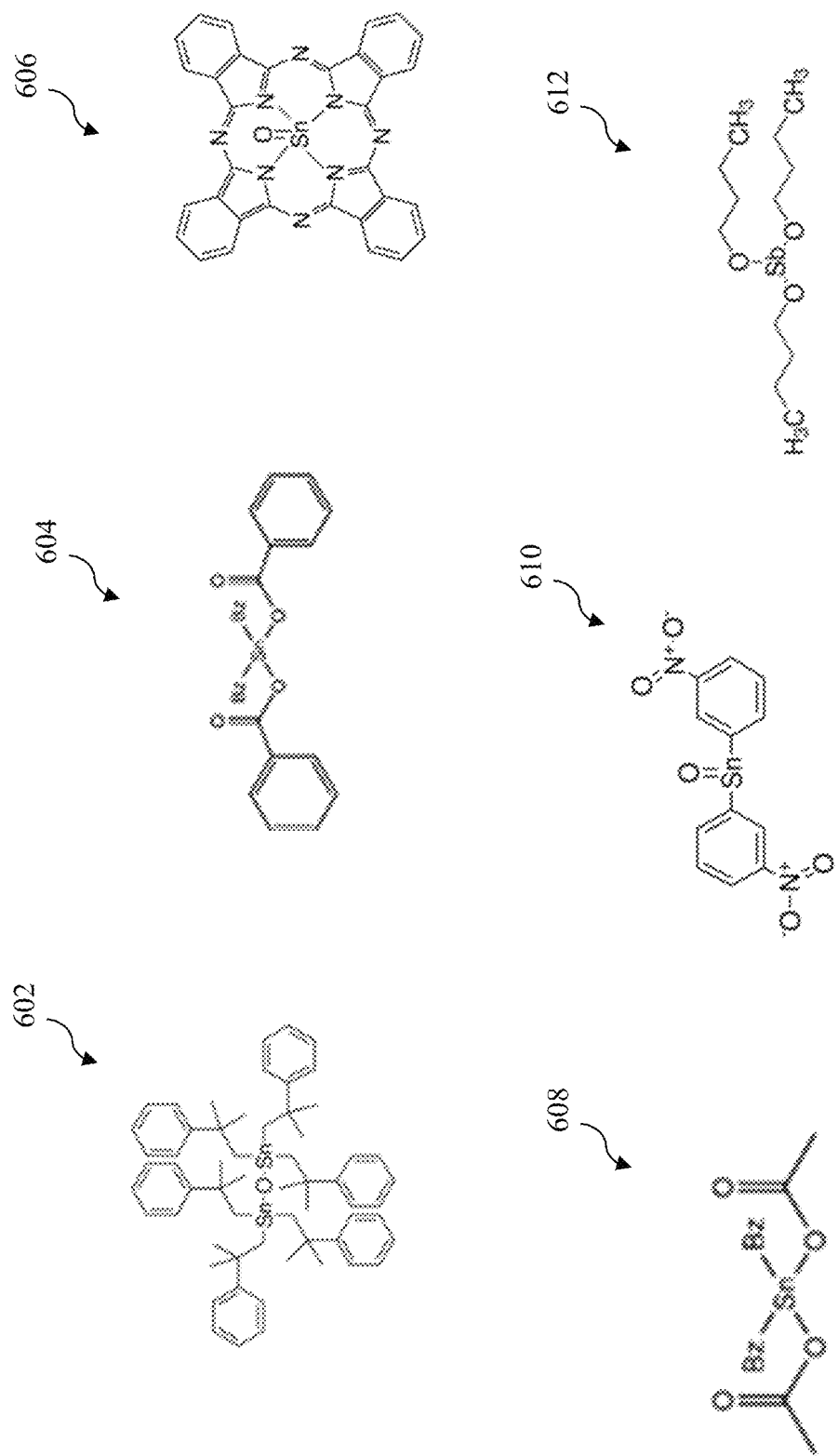
FIG. 6 illustrates a chemical structure of a metal-containing chemical in the resist material of FIG. 3 in accordance with various embodiments.

Existing PAG is not sensitive to EUV radiation. The organic elements in the PAG or resist, such as carbon (C), nitrogen (N), and oxygen (O) are weak in EUV photon absorption. In the present disclosure, the resist material 300 includes metal-containing chemical 310 to enhance EUV absorption and resist efficiency since metals have high EUV photon absorption. The metal-containing chemical 310 includes one or more metallic element, such as barium (Ba), Indium (In), Cerium (Ce) or Tin (Sn). In some embodiments, the metal-containing chemical 310 is metal organic material with metal bonded or otherwise incorporated in an organic chemical. FIG. 6 illustrates the metal-containing chemical 310 according to various examples, such as 602, 604, 606, 608, 610 or 612. The metal-containing chemical 602, 604, 606, 608 or 610 each includes Sn while the metal-containing chemical 612 includes Antimony (Sb). Incorporating metal into the resist material may lead to metal contamination issues in the subsequent fabrication stages. For example, when the resist layer is developed, metal residuals may be left on the workpiece. This issue is to be addressed in the later steps of the method 100. In some embodiments, the metal-containing chemical 310 is mixed with other chemicals (such as polymer and PAG) in the solvent 308; chemically bonded to the polymer 302; or chemically bonded to the PAG 306. Alternatively, the metal-containing chemical 310 is incorporated into the resist material through various combinations of the above mechanisms.

The metal-containing chemical 310 is effective to enhance EUV through one or both of the following mechanisms. In the first mechanism, the metal-containing chemical 310 functions as a sensitizer to increase the sensitivity and efficiency of the resist material. The PAG or other components of the resist material may not be sensitive to EUV but is sensitive to electrons or other radiation, such UV or DUV. Thus, by incorporating the sensitizer, the resist material has an enhanced sensitivity to the first radiation. Particularly, the sensitizer is sensitive to the first radiation and be able to generate a second radiation in response to the first radiation. In the present embodiment, the first radiation is EUV radiation and the second radiation is electron(s). The sensitizer absorbs EUV radiation and generates secondary electron. Furthermore, PAG 306 is sensitive to the secondary electron, absorbs the secondary electron and generates acid. Additionally or alternatively, the sensitizer absorbs the first radiation with a first wavelength and generates second radiation with a second wavelength. The second wavelength is greater than the first wavelength. In furtherance of the embodiment, the first radiation is EUV light and the first wavelength is about 13.5 nm; and the second wavelength ranges between 180 nm and 250 nm.

In a second mechanism illustrated in FIG. 7, the metal-containing chemical 310 each includes a metal core (such as a metal ion, labeled as "M+") and a ligand (labeled as "L")

bonded together. During a lithography exposing process (exposing process), EUV radiation is applied to the resist material. The metal-containing chemical absorbs EUV photons and generates radicals, such as ligands and metal cores. Those radicals may directly cause crosslinking of the polymer 302 such that the exposed portions of the resist material remain during developing. In this case, the resist material is a negative tone resist and does not include acid-generating compound and the blocking group since the EUV radiation causes the crosslinking of the polymer through the metal-containing chemical. In furtherance of the case, the polymer 302 may not be cross-linked or only partially cross-linked before the lithography exposing process.

Additionally, the resist material may further include other sensitizer, such as a fluorine-containing chemical, a phenol-containing chemical or a combination thereof. In some examples, the sensitizer includes polyhydroxystyrene, poly-fluorostyrene, or poly-chlorostyrene.

Referring back to FIGS. 1 and 2B, the method 100 proceeds to operation 106 by performing an exposing process to the resist layer 206 utilizing the first radiation from a lithography system. In the present embodiment, the first radiation is a EUV radiation (e.g., 13.5 nm). In other embodiments, the first radiation may be an I-line (365 nm), a DUV radiation, an x-ray, an electron beam, an ion beam, and/or other suitable radiations. The operation 106 may be performed in air, in a liquid (immersion lithography), or in a vacuum (e.g., for EUV lithography and e-beam lithography). In some embodiments, the radiation beam is directed to the resist layer 206 to form an image of a circuit pattern defined on a photomask (such as a transmissive mask or a reflective mask) in a proper exposing mode such as step-and-scan. Various resolution enhancement techniques, such as phase-shifting, off-axis illumination (OAI) and/or optical proximity correction (OPC), may be used or implemented through the photomask or the exposing process. For examples, the OPC features may be incorporated into the circuit pattern on the photomask. In another example, the photomask is a phase-shift mask, such as an alternative phase-shift mask, an attenuated phase-shift mask, or a chromeless phase-shift mask. In yet another example, the exposing process is implemented in an off-axis illumination mode. In some other embodiments, the radiation beam is directly modulated with a predefined pattern (such as an IC layout) without using a photomask (such as using a digital pattern generator or direct-write mode). In the present embodiment, the radiation beam is a EUV radiation and the operation 106 is performed in a EUV lithography system. Since the sensitivity of the resist layer 206 is enhanced and the exposing threshold of the resist layer may be lower than 20 mJ/cm$^2$. Accordingly, the exposing process is implemented with the dose less than 20 mJ/cm$^2$, according to the present example.

Still referring to the operation 106, after the exposing process, the operation 106 may further include other steps, such as thermal treatment. In the present embodiment, the operation 106 includes a post-exposure baking (PEB) process to the semiconductor structure 200, especially to the resist layer 206 coated on the substrate 202. During the PEB process, according to some examples, the ALG 304 in the exposed resist material is cleaved, and the exposed portions of the resist material 300 are changed chemically (such as becoming more hydrophilic or more hydrophobic). In a specific embodiment, the PEB process may be performed in a thermal chamber at temperature ranging between about 120° C. to about 160° C.

After the operation 106, a latent pattern is formed on the resist layer 206. The latent pattern of a resist layer refers to the exposed pattern on the resist layer, which eventually becomes a physical resist pattern, such as by a developing process. The latent pattern of the resist layer 206 includes unexposed portions 206a and exposed portions 206b. In the present case, the exposed portions 206b of the resist layer 206 are physically or chemically changed. In some examples, the exposed portions 206b are changed in polymerization, such as or cross-linked as in negative-tone resist or depolymerized as in positive-tone resist. In other examples, the exposed portions 206b are de-protected, inducing polarity change for dual-tone imaging (developing).

Referring to FIGS. 1 and 2C, the method 100 then proceeds to operation 108 by developing the exposed resist layer 206 in a developer, constructed in accordance with some embodiments. By the developing process, a patterned resist layer 206' is formed. In some embodiments, the resist layer 206 is a negative-tone resist and the exposed portions of the resist layer experience crosslinking and therefore remain after the developing process. In some embodiments, the resist layer 206 experiences a polarity change after the operation 106, and a dual-tone developing process may be implemented. For examples, the exposed portions of resist layer 206 are changed from a nonpolar state (hydrophobic state) to a polar state (hydrophilic state), then the exposed portions 206b will be removed (positive tone imaging) by an aqueous solvent, such as tetramethyl ammonium hydroxide (TMAH), or alternatively the unexposed portions 206a will be removed (negative tone imaging) by an organic solvent, such as butyl acetate. In some other examples, the resist layer 206 is changed from a polar state to a nonpolar state, then the exposed portions 206b will be removed (positive-tone imaging) by an organic solvent or the unexposed portions 206a will be removed (negative-tone imaging) by an aqueous solvent.

The developer is designed with chemical to form the patterned resist layer 206' and further effectively remove metal residuals on the workpiece. In the present embodiment, the developer includes a solvent and a chemical additive that is effective in removal of the metal residuals and developing the resist layer. In various examples, the solvent includes an organic solvent and may additionally include an aqueous solvent mixed with the organic solvent. Our experimental data indicated that the effective removal of the metal residuals is determined by following factors of the developing process and the associated developer: the chemical compositions and concentrations, Hansen solubility parameters, acidity, and temperature of the developer, such as a proper combination thereof. The developing process and the developer are designed and tuned accordingly, which are further described below in details.

In some embodiments, the solvent is an organic solvent designed with Hansen solubility parameters (delta D, delta P, and delta H) in the following ranges, 18>delta D>3, 7>delta P>1, and 7>delta H>1. The organic solvent may include n-Butyl acetate, Methyl n-Amyl Ketone, Hexane, Heptane, or Amyl Acetate, according to various examples.

In some other embodiments, the developer may additionally include a second solvent mixed with the organic solvent. The second solvent is designed with Hansen solubility parameters (delta D, delta P, and delta H) in the following ranges, 25>delta D>13, 25>delta P>3, and 30>delta H>4. In this case, the organic solvent has a weight percentage greater than 60 w % while the second solvent has a weight percentage less than 40 w %. Here a weight percentage of a solvent is defined as a weight ratio as W/WO, wherein the W is the weight of the solvent while WO is weight of the developer in a given volume. The second solvent may be an aqueous solvent or another organic solvent with a polar function group, such as —OH, —COOH, —CO—, —O—, —COOR, —CN—, —SO—, —CON—, or —NH—. In various examples, the second solvent is another organic solvent, such as propylene glycol monomethyl ether (PGME), PGEE (1-Ethoxy-2-propanol), GBL (Gamma-Butyrolactone), CHN (Cyclohexanone), EL (Ethyl lactate), Methanol, Ethanol, Propanol, n-Butanol, Acetone, DMF (Dimethylformamide), Acetonitrile, Isopropyl alcohol (IPA), THF (Tetrahydrofuran), Acetic acid, or a combination thereof.

In some embodiments when the solvent includes both organic solvent and aqueous solvent mixed together, the weight percentage of the aqueous solvent over the total weight of the developer is less than 20 w %. The aqueous solvent includes water, ethylene glycol or a combination thereof in various examples. In this case, the aqueous solvent may be further mixed with aqueous acid (such as hydrofluoric acid (HF) or hydrochloric acid (HCl)) or aqueous base (such as NH4OH) with weight percentage to the total weight of the developer less than 5 w %.

The chemical additive in the developer includes organic acid, organic base, chelate additive or a combination thereof, to enhance developing capability. In some embodiments, chemical additive includes an organic acid tuned with the logarithmic constant pKa in a range $-11<pKa<4$. In furtherance of the embodiments, the weight percentage of the organic acid in the developer ranges between 0.001 w % and 30 w %, or 0.1 w % and 20 w %. in various examples, the organic acid includes ethanedioic acid, methanoic acid, 2-hydroxypropanoic acid, 2-hydroxybutanedioic acid, Citric acid, Uric acid, Trifluoromethanesulfonic acid, Benzenesulfonic acid, ethanesulfonic acid, methanesulfonic acid, Oxalic acid dihydrate, Maleic acid, or a combination thereof.

In some embodiments, the chemical additive in the developer includes an organic base tuned with the logarithmic constant pKa in a range $40>pKa>9$. In furtherance of the embodiments, the weight percentage of the organic base in the developer ranges between 0.001 w % and 30 w %, or 0.1 w % and 20 w %. In various examples, the organic base includes Monoethanolamine, Monoisopropanolamine, 2-Amino-2-methyl-1-propanol, 1H-Benzotriazole, 1,2,4-Triazole, 1,8-Diazabicycloundec-7-ene, or a combination thereof.

In some embodiments, the chemical additive in the developer includes chelate additive having a weight percentage to the developer in a range between 0.001 w % and 30 w %, or 0.1 w % and 20 w %. In various examples, the chelate additive includes Ethylenediaminetetraacetic acid (EDTA), Ethylenediamine-N,N'-disuccinic acid (EDDS), diethylenetriaminepentaacetic acid (DTPA), Polyaspartic acid, trans-1,2-Cyclohexanediamine-N,N,N',N'-tetraacetic acid monohydrate, ethylenediamine, or a combination thereof.

In some embodiments, the developer further includes a surfactant with a weight percentage less than 5 w %, to increase the solubility and reduce the surface tension on the substrate.

In some embodiments, the operation 108 includes two steps, a first step 108A by performing a first developing process with a first developer having a solvent and a chemical additive (the first developer is described above in details); and a second step 108B by performing a second developing process with a second developer, such as an existing developer like n-Butyl acetate (nBA) solvent, or Methyl a-Amyl Ketone (MAK) solvent without chemical additive. In furtherance of the embodiments, the first developer in the first step 108A is heated to a high temperature before applied to the workpiece while the second developer in the second step 108B is not heated when or before being applied to the workpiece. For example, the first developer is heated to a temperature T1 in a range as, the room temperature $<T1<75°$ C. while the second developer is at the room temperature without heating. In various examples, the first step 108A and the second step 108B may be in a different sequence (such as swapped into an opposite sequence: implement 108B first and implement 108A thereafter).

In some example illustrated in FIG. 2C, the unexposed portions 206a are removed in the developing process. In this example shown in FIG. 2C, the patterned resist layer 206' is represented by two line patterns (this type of resist is referred to as negative tone resist). However, the following discussion is equally applicable to resist patterns represented by trenches.

Referring to FIGS. 1 and 2D, the method 100 includes an operation 110 by performing a fabrication process to the semiconductor structure 200 using the patterned resist layer 206' as a mask such that the fabrication process is only applied to the portions of the semiconductor structure 200 within the openings of the patterned resist layer 206' while other portions covered by the patterned resist layer 206' are protected from being impacted by the fabrication process. In some embodiments, the fabrication process includes an etching process applied to the material layer 204 using the patterned resist layer 206' as an etch mask, thereby transferring the pattern from the patterned resist layer 206' to the material layer 204. In alternative embodiments, the fabrication process includes an ion implantation process applied to the semiconductor structure 200 using the patterned resist layer as an implantation mask, thereby forming various doped features in the semiconductor structure 200.

In the present example, the material layer 204 is a hard mask layer. To further this embodiment, the pattern is first transferred from the patterned resist layer 206' to the hard mask layer 204, then to other layers of the substrate 202. For example, the hard mask layer 204 may be etched through openings of the patterned resist layer 206' using a dry (plasma) etching, a wet etching, and/or other etching methods. For example, a dry etching process may implement an oxygen-containing gas, a fluorine-containing gas, a chlorine-containing gas, a bromine-containing gas, an iodine-containing gas, other suitable gases and/or plasmas, and/or combinations thereof. The patterned resist layer 206' may be partially or completely consumed during the etching of the hard mask layer 204. In an embodiment, any remaining portion of the patterned resist layer 206' may be stripped off, leaving a patterned hard mask layer 204' over the substrate 202, as illustrated in FIG. 2E.

Although not shown in FIG. 1, the method 100 may include other operations before, during or after the operations described above. In an embodiment, the substrate 202 is a semiconductor substrate and the method 100 proceeds to forming fin field effect transistor (FinFET) structures. In this embodiment, the method 100 includes forming a plurality of active fins in the semiconductor substrate 202. In furtherance of the embodiment, the operation 110 further includes etching the substrate 202 through the openings of the patterned hard mask 204' to form trenches in the substrate 202; filling the trenches with a dielectric material; performing a chemical mechanical polishing (CMP) process to form shallow trench isolation (STI) features; and epitaxy growing or recessing the STI features to form fin-like active regions. In another embodiment, the method 100 includes other operations to form a plurality of gate electrodes in the semiconductor substrate 202. The method 100 may further form gate spacers, doped source/drain regions, contacts for gate/source/drain features, etc. In another embodiment, a target pattern is to be formed as metal lines in a multilayer interconnection structure. For example, the metal lines may be formed in an inter-layer dielectric (ILD) layer of the substrate 202, which has been etched by operation 110 to form a plurality of trenches. The method 100 proceeds to filling the trenches with a conductive material, such as a metal; and further proceeds to polishing the conductive material using a process such as chemical mechanical planarization (CMP) to expose the patterned ILD layer, thereby forming the metal lines in the ILD layer. The above are non-limiting examples of devices/structures that can be made and/or improved using the method 100 and the material layer 206 according to various aspects of the present disclosure.

The present disclosure provides a lithography process with respective photoresist material and developer to achieve enhanced sensitivity without metal contamination. The resist material includes metal-containing chemical and the developer includes a solvent and a chemical additive, such as organic acid, organic base or chelate designed to effectively remove the metal residuals. The developing operation may include two steps with different developers or additionally with different temperature. Accordingly, the sensitivity of the resist material is enhanced and the metal contamination is eliminated.

Thus, the present disclosure provides a method for lithography patterning in accordance with some embodiments. The method includes forming a photoresist layer over a substrate, wherein the photoresist layer includes a polymer, a metal-containing chemical, and an acid generating compound; performing an exposing process to the photoresist layer; and performing a first developing process to the photoresist layer using a first developer, thereby forming a patterned resist layer, wherein the first developer includes a first solvent and a chemical additive to remove metal residuals generated from the metal-containing chemical.

The present disclosure provides a method for lithography patterning in accordance with some other embodiments. The method includes coating a photoresist layer over a substrate, wherein the photoresist layer includes a polymer, a metal-containing chemical, and an acid generating compound; performing an exposing process to the photoresist layer; performing a first developing process to the photoresist layer using a first developer; and performing a second developing process to the photoresist layer using a second developer different from the first developer, thereby forming a patterned resist layer, wherein the first developer includes a first solvent and a chemical additive to effectively remove the metal residuals.

The present disclosure provides a method for lithography patterning in accordance with some other embodiments. The method includes forming a photoresist layer over a substrate, wherein the photoresist layer includes a polymer, a metal-containing chemical, and an acid generating compound; performing an exposing process to the photoresist layer; and performing a developing process to the photoresist layer. The developing process includes: applying a first developer of a first temperature to the photoresist layer and applying a second developer of a second temperature to the photoresist layer, thereby forming a patterned resist layer and effectively remove metal residuals. The second developer is different from the first developer. The second temperature is lower than the first temperature. The first developer includes a first solvent and a chemical additive. The second developer includes a second solvent and is free of the chemical additive.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a material layer on a substrate;
   forming a photoresist layer directly on the material layer disposed on the substrate, wherein a composition of the photoresist layer includes a metal-containing chemical;
   performing an exposing process to the photoresist layer;
   prior to performing any etching of the material layer, performing a first developing process to the photoresist layer using a first developer to pattern the photoresist layer, wherein the first developer removes metal residuals generated from the metal-containing chemical, wherein the performing of the first developing process includes heating the first developer to a first temperature; and
   after the performing of the first developing process, performing an ion implantation process on the material layer while using the patterned photoresist layer as a mask.

2. The method of claim 1, further comprising performing a second developing process to the photoresist layer using a second developer to pattern the photoresist layer, wherein the second developer has a different material composition than the first developer.

3. The method of claim 2, wherein the performing of the first developing process occurs prior to the performing of the second developing process.

4. The method of claim 2, wherein the performing of the second developing process occurs prior to the performing of the first developing process.

5. The method of claim 2, wherein the performing of the second developing process to the photoresist layer using the second developer to pattern the photoresist layer occurs without heating the second developer to the first temperature.

6. The method of claim 1, wherein the first temperature is in a range greater than room temperature and less than 75° C.

7. The method of claim 1, wherein the metal-containing chemical is selected from the group consisting of barium (Ba), indium (In), cerium (Ce), tin (Sn) and antimony (Sb).

8. The method of claim 1, wherein the photoresist layer further includes a polymer, an acid liable group, a photoacid generator and a solvent.

9. A method comprising
   forming a material layer on a substrate;
   forming a photoresist layer on the material layer, wherein a composition of the photoresist layer includes a metal-containing component;

performing an exposing process to the photoresist layer;
prior to etching the material layer, performing a first developing process to the photoresist layer using a first developer, the first developer including a first solvent and a chemical additive; and
performing a second developing process to the photoresist layer using a second developer that has a different material composition than the first developer, wherein the second developer is free of the chemical additive, wherein the performing of the first and second developing processes on the photoresist layer forms a patterned photoresist layer.

10. The method of claim 9, wherein the chemical additive is selected from the group consisting of an organic acid, an organic base and a chelate.

11. The method of claim 10, wherein the organic acid is selected from the group consisting of ethanedioic acid, methanoic acid, 2-hydroxypropanoic acid, 2-hydroxybutanedioic acid, Citric acid, Uric acid, Trifluoromethanesulfonic acid, Benzenesulfonic acid, ethanesulfonic acid, methanesulfonic acid, Oxalic acid dihydrate, and Maleic acid,
wherein the organic base is selected from the group consisting of Monoethanolamine, Monoisopropanolamine, 2-Amino-2-methyl-1-propanol, 1H-Benzotriazole, 1,2,4-Triazole, and 1,8-Diazabicycloundec-7-ene,
wherein the chelate is selected from the group consisting of Ethylenediaminetetraacetic acid (EDTA), Ethylenediamine-N,N'-disuccinic acid (EDDS), diethylenetriaminepentaacetic acid (DTPA), Polyaspartic acid, trans-1,2-Cyclohexanediamine-N,N,N',N'-tetraacetic acid monohydrate, and ethylenediamine.

12. The method of claim 9, further comprising etching the material layer while using the patterned photoresist layer as a mask after performing the first and second developing processes.

13. The method of claim 9, further comprising performing an ion implantation process on the material layer while using the patterned photoresist layer as a mask after performing the first and second developing processes.

14. The method of claim 9, wherein the first solvent has Hansen solubility parameters of delta D in a range between 3 and 18, delta P in a range between 1 and 7, and delta H in a range between 1 and 7, and
wherein the second developer includes a second solvent having Hansen solubility parameters of delta D in a range between 13 and 25, delta P in a range between 3 and 25, and delta H in a range between 4 and 30.

15. The method of claim 9, wherein the material layer includes a conductive material layer.

16. A method comprising:
forming a material layer on a substrate;
forming a photoresist layer on the material layer, wherein a composition of the photoresist layer includes a metal-containing component;
performing an exposing process to the photoresist layer; and
prior to performing any etching of the material layer, performing a development process on the photoresist layer that includes:
applying a first developer having a first temperature to the photoresist layer; and
applying a second developer having a second temperature to the photoresist layer, wherein the applying of the first and second developers forms a patterned photoresist layer that exposes a portion of the material layer, wherein the second developer has a different material composition than the first developer, wherein the second temperature is different than the first temperature.

17. The method of claim 16, wherein the first developer includes a chemical additive selected from the group consisting of an organic acid, an organic base and a chelate, and
wherein the second developer is free of the selected chemical additive.

18. The method of claim 16, wherein the second temperature is room temperature.

19. The method of claim 16, further comprising performing a thermal treatment process on the photoresist layer after the performing of the exposing process such that the photoresist layer undergoes a chemical change.

20. The method of claim 16, further comprising performing an ion implantation process on the exposed portion of the material layer while using the patterned photoresist layer as a mask.

* * * * *